(12) United States Patent
Joet et al.

(10) Patent No.: US 11,459,227 B2
(45) Date of Patent: Oct. 4, 2022

(54) HINGED MICROELECTROMECHANICAL AND/OR NANOELECTROMECHANICAL DEVICE WITH OUT-OF-PLANE MOVEMENT

(71) Applicant: COMMISSARIAT A L'ENERGIE ATOMIQUE ET AUX ENERGIES ALTERNATIVES, Paris (FR)

(72) Inventors: Loic Joet, Claix (FR); Audrey Berthelot, Saint Ismier (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 509 days.

(21) Appl. No.: 16/348,004

(22) PCT Filed: Nov. 9, 2017

(86) PCT No.: PCT/FR2017/053062
§ 371 (c)(1),
(2) Date: May 7, 2019

(87) PCT Pub. No.: WO2018/087482
PCT Pub. Date: May 17, 2018

(65) Prior Publication Data
US 2021/0114865 A1   Apr. 22, 2021

(30) Foreign Application Priority Data

Nov. 10, 2016   (FR) ...................................... 1660915

(51) Int. Cl.
*B81B 3/00*   (2006.01)
(52) U.S. Cl.
CPC .... *B81B 3/0051* (2013.01); *B81B 2201/0235* (2013.01); *B81B 2203/0109* (2013.01); *B81B 2203/0154* (2013.01); *B81B 2203/058* (2013.01)

(58) Field of Classification Search
CPC .................................................. B81B 3/0051
See application file for complete search history.

(56) References Cited

U.S. PATENT DOCUMENTS

2010/0253925 A1\* 10/2010 Suzuki ............... G03F 7/70091
355/67
2011/0147860 A1   6/2011 Robert et al.
(Continued)

FOREIGN PATENT DOCUMENTS

WO    WO 2014/096655 A1   6/2014

OTHER PUBLICATIONS

U.S. Appl. No. 14/971,045, filed Dec. 16, 2015, US 2016-0178544 A1, Alexandre Causier, et al.
(Continued)

*Primary Examiner* — Moazzam Hossain
(74) *Attorney, Agent, or Firm* — Oblon, McClelland, Maier & Neustadt, L.L.P.

(57) ABSTRACT

Disclosed is a hinged MEMS and/or NEMS device with out-of-plane movement including a first portion and a second portion that is hinged so as to be able to rotate with respect to the first portion about an axis of rotation contained in a first mean plane of the device. The device also includes a hinging element that connects the first portion and the second portion and that is stressed flexurally and a sensing element that extends between the first portion and the second portion and that deforms during the movement of the second portion. Finally, the device includes two blades that extend perpendicularly to the mean plane of the hinge device and parallel to the axis of rotation, the blades being placed between the hinging element and the sensing element and connecting the first portion and the second portion and being stressed torsionally during the movement of the second portion.

16 Claims, 7 Drawing Sheets

(56) References Cited

U.S. PATENT DOCUMENTS

2012/0210792 A1  8/2012  Robert et al.
2015/0355221 A1  12/2015 Robert et al.

OTHER PUBLICATIONS

U.S. Appl. No. 15/488,056, filed Apr. 14, 2017, US 2017/0298525 A1, Yoan Bourlier, et al.
U.S. Appl. No. 15/625,314, filed Jun. 16, 2017, US 2017/0363424 A1, Federico Maspero, et al.
U.S. Appl. No. 15/918,008, filed Mar. 12, 2018, US 2018/0265348 A1, Audrey Berthelot, et al.
U.S. Appl. No. 16/008,578, filed Jun. 14, 2018, US 2018/0362333 A1, Federico Maspero, et al.
International Search Report dated Dec. 19, 2017 in PCT/FR2017/053062 filed Nov. 9, 2017.
French Preliminary Search Report dated Jun. 28, 2017 in French Application No. 1660915 filed Nov. 10, 2016.

\* cited by examiner

HINGED MICROELECTROMECHANICAL AND/OR NANOELECTROMECHANICAL DEVICE WITH OUT-OF-PLANE MOVEMENT

TECHNICAL FIELD AND PRIOR ART

The present invention relates to a hinged microelectromechanical and/or nanoelectromechanical device with out-of-plane movement.

Microelectromechanical systems or MEMS and/or nanoelectromechanical systems or NEMS generally comprise at least one part that is capable of moving relative to a substrate. This moving part can have an out-of-plane movement, i.e. a movement in a direction that is orthogonal to the plane of the substrate.

The moving part can be hinged relative to the substrate by a hinge-type joint, whereby the moving part thus pivots about the axis of the hinge relative to the substrate.

The out-of-plane movement of the moving part is increasingly used in sensors. It is used, for example, in multi-axis sensors. For example, inertial units can comprise up to 10 measurement axes: three accelerometers, three gyrometers, three magnetometers and a pressure sensor, in order to detect the movements in the three directions.

The movement of the moving part must be detected and measured. In a well-known manner, one or more strain gauges are implemented, for example one or more piezoelectric or piezoresistive gauges.

The joint forming the hinge is, for example, obtained by means of two blades extending perpendicularly to the plane of the device, one edge whereof is connected to the moving part and one opposite edge whereof is connected to the substrate. The blades undergo torsional deformation about an axis parallel to the plane and define the axis of rotation, allowing the moving part to have an out-of-plane rotational movement.

In order to produce a lever arm, a highly-efficient hinge-gauge system is sought so as to capture a maximum signal at the gauge.

For this purpose, the following should be obtained:
- a hinge, the angular stiffness whereof is significantly less than that induced by the compression of the gauge during rotation, such that the energy lost during the deformation of the hinge is less than, and advantageously negligible relative to the useful energy used to compress the gauge.
- a hinge, the resistance whereof to compression is significantly greater than that of the gauge such that the lever arm rotates about the hinge, compressing the gauge, and not the other way around.

In order to fulfil the first condition, the width of the torsionally-stressed blades should be decreased and/or the length of the torsionally-stressed blades should be increased; however, in order to fulfil the second condition, this width should be increased. When modifying the width and/or length of the torsionally-stressed blades, the compression and angular stiffnesses are impacted in identical proportions. The evolution of the angular stiffness and that of the compression stiffness cannot be uncorrelated, thus making the production of this hinge the result of a compromise therebetween. When softening the blades, an increase in the energy lost during the compression of the hinge is observed. When hardening the blades, an increase in the energy lost during the deformation of the blades is observed.

These two energy losses occur at the expense of the compression of the gauge.

DESCRIPTION OF THE INVENTION

As a result, one purpose of the present invention is to provide a hinged microelectromechanical and/or nanoelectromechanical device with out-of-plane rotational movement procuring a high conversion efficiency.

The purpose of the present invention is fulfilled by a hinged device comprising a first part and a second part that is capable of moving relative to the first part about an axis of rotation, at least the second part extending between a first and a second parallel planes, at least one blade extending perpendicularly to the first plane and to the second plane and parallel to the axis of rotation, said at least one blade connecting the first part and the second part, the blade being intended to undergo at least torsional deformation during the rotational movement of the second part relative to the first part. The device comprises at least one hinging element in the form of a blade connecting the first part and the second part, such that the first part and the second part are hinged so as to be able to rotate about an axis parallel to the first plane. The device further comprises at least one sensing element that senses the movement of the second part relative to the first part, said sensing element being suspended between the first part and the second part. The at least one blade having undergone torsional deformation is arranged between the hinging element and the sensing element.

Advantageously, the second part has a dimension in a first direction orthogonal to the first and second planes that is significantly greater than the dimensions in the first direction of the hinging element and of the sensing element.

For example, in the case of an accelerometer, the second part forms, for example, the inertial mass with out-of-plane movement. It has a large thickness and forms a rigid lever arm, limiting the energy losses during the deformation thereof. The sensing element can be a strain gauge, the hinging element in the form of a blade has an angular stiffness that is significantly lower than that induced by the compression of the sensing element. Thus, the proportion of energy used to deform the hinge is significantly lower than the useful proportion, used to compress the gauge. The hinge can advantageously be made of one or more blades connecting the fixed part of the MEMS to the lever arm. The sum of the sections of these blades will thus be dimensioned such that the hinge has a compression stiffness that is significantly greater than that of the gauges. Thus, the energy resulting from the movement of the second part preferentially compresses the gauges rather than the hinge, such that the arm rotates about the hinge joint, compressing the gauges, the compression of the gauges being negligible.

The axis of rotation is thus as close as possible to the hinging element, or is even in the hinging element.

The gauge is advantageously thin, which allows the strains to be concentrated and thus the signal to be amplified.

The torsional blades provide significant stiffness in the out-of-plane direction and the torsional stiffness thereof is negligible relative to that caused by the elongation/compression of the gauge during the rotational movement of the second part.

Moreover, by implementing a hinge in the form of a flexurally-deformed blade, a significant compressive stiffness is obtained with a low angular stiffness.

The blades capable of undergoing torsional deformation limit the out-of-plane movements, or even eliminate them, which the very thin hinging element cannot accomplish.

Moreover, the blades have a low angular stiffness as a result of the low thickness thereof, and thus have no or little influence on the efficiency of the device.

The hinge joint capable of undergoing flexural deformation limits the in-plane movements, or even eliminates them. Moreover, this element has a limited angular stiffness as a result of the low thickness thereof.

The combination of blades capable of undergoing torsional deformation, blocking the out-of-plane movements with the hinge joint blocking the in-plane movements forms a hinge, the axis of rotation whereof lies substantially at the intersection between the mean planes of the blades and of the hinge joint capable of undergoing flexural deformation.

In other words, the functions are separated by firstly procuring the resistance to in-plane movements function by means of a thin element oriented such that it has a very low angular stiffness and a high compressive stiffness, and by secondly procuring the resistance to out-of-plane movements function by thin blades oriented such that they have a very low angular stiffness. Each element compensates for the high flexibility of the other in the direction of greatest flexibility thereof. Each of the elements can thus be individually optimized.

Advantageously, the plane of greatest rigidity of the blades capable of undergoing torsional deformation is orthogonal to the plane of greatest rigidity of the hinge joint capable of undergoing flexural deformation.

Advantageously, the sensing element is made of piezoresistive or piezoelectric material. If the sensing element is a piezoelectric material, the device can be an out-of-plane actuator by polarizing the piezoelectric material.

This limits the energy losses and fixes the axis of rotation as close as possible to the centre of these blades.

The subject-matter of the present invention thus is a hinged MEMS and/or NEMS device with out-of-plane movement comprising a first part, a second part, the second part being hinged so as to be able to rotate with respect to the first part about an axis of rotation contained in a plane parallel to a mean plane of the device, at least one hinging element connecting the first part and the second part and stressed flexurally, at least one sensing element extending between the first part and the second part and being intended to be deformed during the movement of the second part relative to the first part, at least one blade extending perpendicularly to the mean plane of the hinged device and parallel to the axis of rotation, said at least one blade connecting the first part and the second part and being intended to be stressed torsionally during the movement of the second part relative to the first part, said at least one blade being arranged between the hinging element and the sensing element in a direction that is orthogonal to the mean plane of the device.

The characteristic described as "said at least one blade being arranged between the hinging element and the sensing element, along the axis that is orthogonal to the mean plane" means that the blade, the hinging element and the sensing element are arranged in separate planes distributed in this direction, and that when looking in this direction, the blade is between the hinging element and the sensing element. This characteristic is not limited to a superimposition of the blade, the hinging element and the sensing element in this direction.

Preferably, the hinging element has a very low angular stiffness compared to that produced by the sensing element and has a very high compression stiffness compared to that of the sensing element.

The hinging element advantageously has a dimension in a direction perpendicular to the mean plane of the device that is small compared to that in the direction of the axis of rotation.

The second part advantageously has a dimension in a direction orthogonal to the mean plane of the hinged device that is very large compared to that of the hinging element and of the sensing element.

Preferably, the device comprises two torsionally-stressed blades (10).

In one embodiment, the hinging element and/or the sensing element is (are) formed in one piece with the first part and the second part.

The hinged MEMS and/or NEMS device can comprise a plurality of hinging elements parallel to one another and/or a plurality of sensing elements parallel to one another.

Another subject-matter of the present invention further is an MEMS and/or NEMS sensor comprising at least one hinged device according to the invention, the at least one sensing element comprising a piezoelectric material, a piezoelectric material or a resonant gauge.

Another subject-matter of the present invention further is an MEMS and/or NEMS actuator comprising at least one hinged device according to the invention, the at least one sensing element comprising a piezoelectric material.

Another subject-matter of the present invention further is a method for manufacturing a hinged MEMS and/or NEMS device according to the invention comprising, from a substrate comprising a first thick layer of semi-conductive material, a first oxide layer and a monocrystalline semi-conductive layer on the oxide layer, the steps of:

a) structuring the monocrystalline semi-conductive layer so as to form at least one hinging element or at least one sensing element, b) forming a localized protective layer on said at least one hinging element or at least one sensing element, c) forming a second thick layer on the protective layer, d) forming a trench in front of the protective layer and opening out onto said protective layer, e) at least partially obstructing said trench, f) forming the at least one sensing element or at least one hinging element and the at least one blade intended to be torsionally secured, g) releasing the hinged device.

The at least partial obstruction of the trench can comprise fully closing off the trench at one open end or the formation of a layer on the walls of the trench.

Preferably, the second thick layer is formed by epitaxy.

Another subject-matter of the present invention further is a method for manufacturing a hinged MEMS and/or NEMS device according to the invention, comprising, after step d), the steps of:

placing on an element comprising at least one third thick semi-conductive layer and a second oxide layer such that the second thick layer and the second oxide layer are in contact with one another, removing the first thick layer and the first oxide layer, structuring the second thick layer so as to form the at least one sensing element or at least one hinging element and the at least one blade intended to be torsionally secured.

Another subject-matter of the present invention further is a method for manufacturing a hinged MEMS and/or NEMS device according to the invention, comprising, from a thick substrate, the steps of:

producing a trench so as to delimit the at least one sensing element or at least one hinging element and the at least one blade intended to be torsionally secured, entirely filling said trench with a material, forming a layer on the material filling the trench and on the substrate, structuring said layer so as to delimit the at least one hinging element or the at least one sensing element, removing the material filling the trench.

Another subject-matter of the present invention further is a method for manufacturing a hinged MEMS and/or NEMS device according to the invention comprising, from a substrate comprising a first thick layer of semi-conductive material, a first oxide layer and a monocrystalline semi-conductive layer on the oxide layer, the steps of:

a') structuring the monocrystalline semi-conductive layer so as to form at least one hinging element or at least one sensing element, b') forming a localized protective layer on said at least one hinging element or at least one sensing element, c') forming a second thick layer on the protective layer, d') forming a layer intended to form the at least one hinging element or the at least one sensing element, e') structuring said layer intended to form the at least one hinging element or the at least one sensing element, so as to form the at least one hinging element or the at least one sensing element, f') deep etching the second thick layer until reaching the protective layer and the first oxide layer, g') releasing the device.

BRIEF DESCRIPTION OF THE FIGURES

The present invention will be better understood upon reading the following description provided with reference to the accompanying figures, in which.

DETAILED DESCRIPTION OF SPECIFIC EMBODIMENTS

Figure 1:
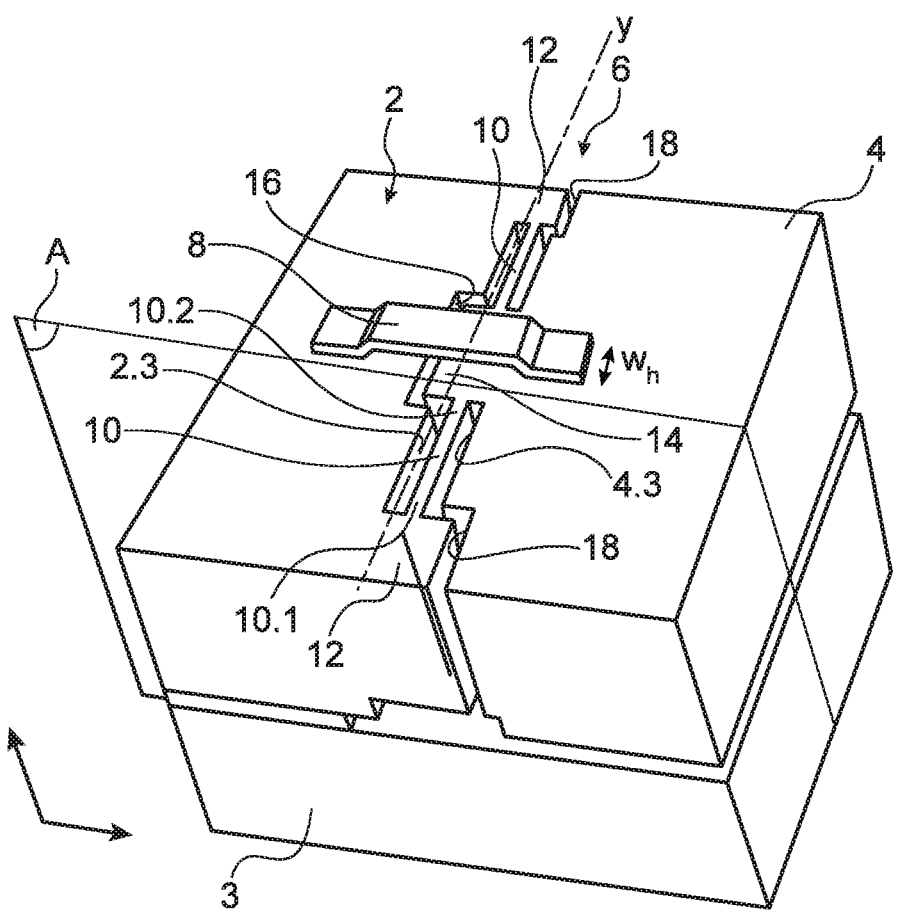
FIG. 1 is a perspective overhead view of one example embodiment of a hinging device according to the invention.
Figure 2:
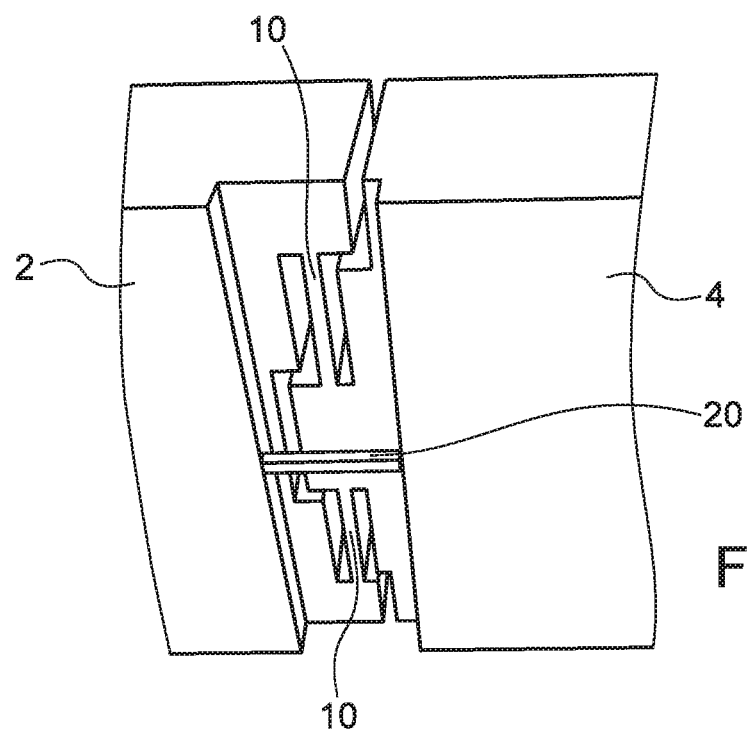
FIG. 2 is a partial perspective view of the device in FIG. 1 from underneath, in which the substrate is not shown.
Figure 3:
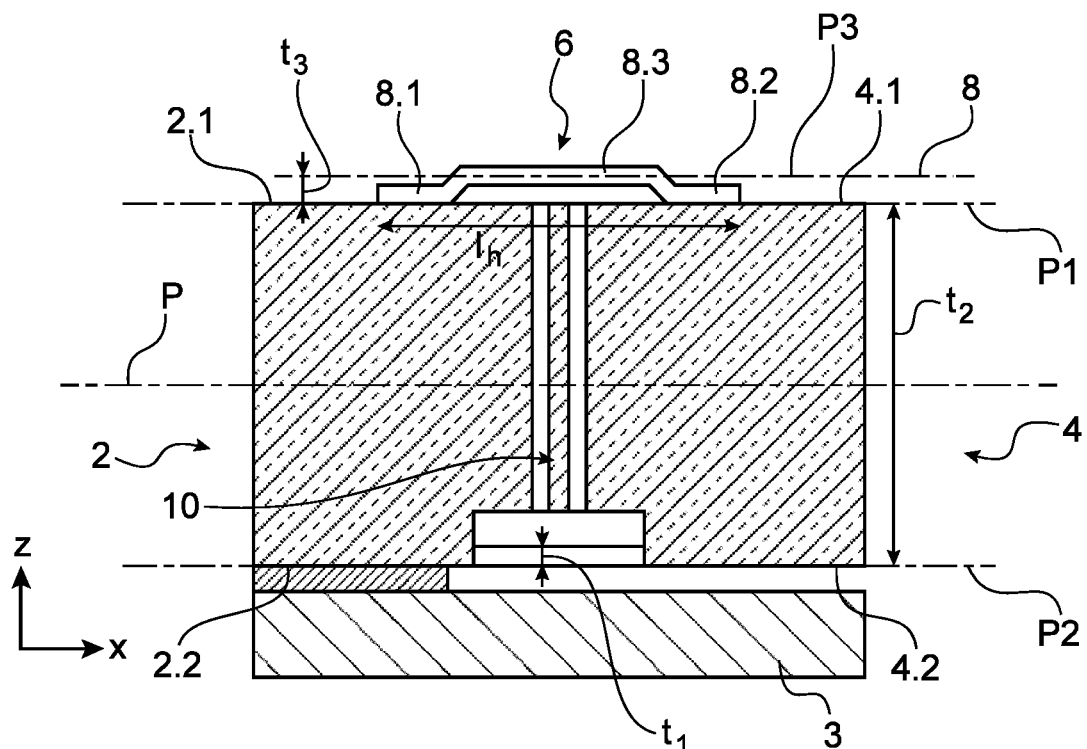
FIG. 3 is a sectional view of the device in FIGS. 1 and 2 along the cutting plane A.

FIGS. 1 to 3 show one example embodiment of a hinged device according to the invention.

The device comprises a first part 2 and a second part 4 that are capable of moving relative to one another. For example, the first part 2 is fixed relative to a substrate 3 of an MEMS and/or NEMS structure. The first and second parts are arranged beside one another and a hinging system 6 connects the first part 2 and the second part 4 in a hinged manner about an axis of rotation Y.

The MEMS structure comprises a mean plane relative to which the in-plane movements and the out-of-plane movements are defined.

The first and second parts 2, 4 extend between two planes P1, P2 parallel to the mean plane P of the structure.

The first part 2 comprises a first face 2.1 contained in the plane P1 and a second face 2.2 contained in the plane P2. The second part 4 comprises a first face 4.1 contained in the plane P1 and a second face 4.2 contained in the plane P2.

In the example shown, the hinging system 6 comprises a hinging element 8 in the form of a thin strip extending in the first side 2.1 of the first part 2 and the first side 4.1 of the second part 4. The hinging element 8 extends along an axis X and forms a hinge substantially defining the orientation and location of the axis of rotation Y of the hinging system. The axis of rotation is orthogonal to the axis X. In the example shown, the hinging element comprises two end portions 8.1, 8.2 respectively in contact with the sides 2.1 and 4.1 and one central portion 8.3 connecting the two end portions 8.1 and 8.2 and arranged in a plane P3 that is parallel and separate from the plane P1. However, this is in no way limiting, whereby a planar hinging element remains within the scope of the present invention.

Moreover, a device in which the hinging element is formed in one piece with the first part and the second part also remains within the scope of the present invention.

The thickness of the hinging element 8 in a direction Z perpendicular to the planes P1 and P2 is low enough for the angular stiffness induced by the deformation of the strip to be significantly lower than that induced by the compression of a sensing element, which will be described hereafter. The energy setting the second part in motion thus mainly serves to deform the sensing element and not the hinging element. Moreover, the hinging element provides very high elongation/compression stiffness along the axis X, such that the location of the axis of rotation Y is well defined and is thus situated as close as possible to the hinging element. The thickness of the hinging element lies, for example, in the range 100 nm to several µm.

Figure 4:
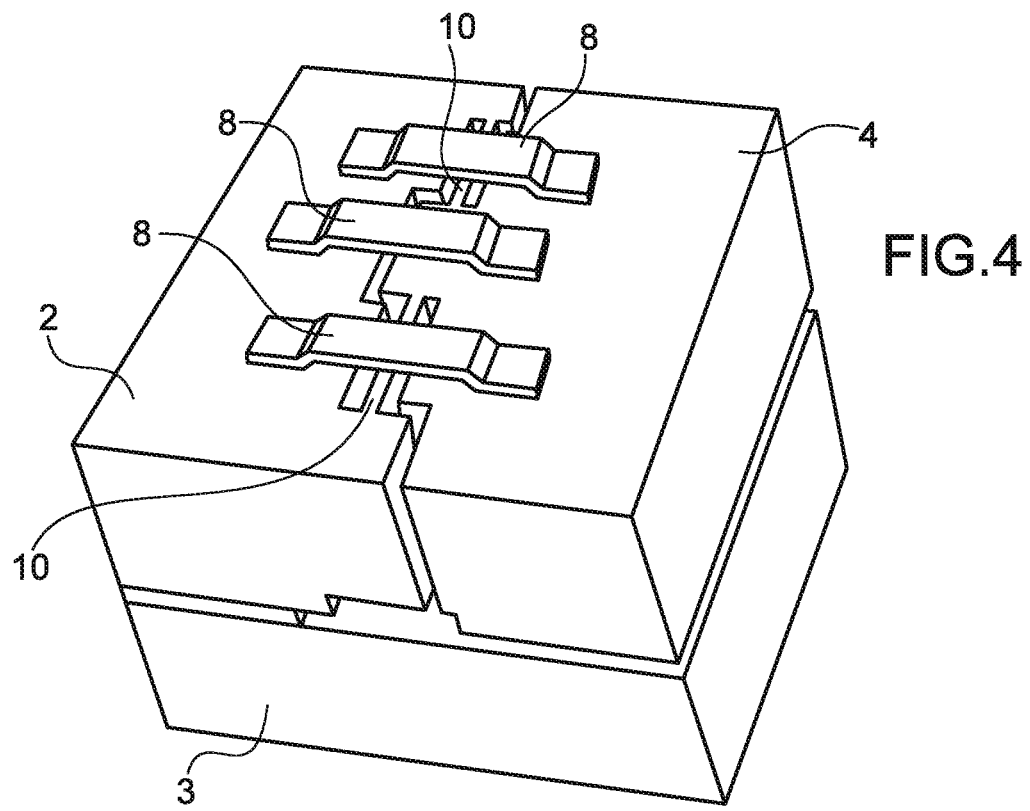
FIG. 4 is a perspective overhead view of another example embodiment of a hinging device according to the invention, in which the hinged joint implements a plurality of hinging elements.

As a variant, as shown in FIG. 4, the device can comprise a plurality of hinging elements arranged parallel to one another and parallel to the axis X between the first part and the second part and distributed along the axis Y. The sections of the hinging elements are chosen such that the sum thereof has a compression stiffness that is significantly greater than that of the sensing element.

To give an order of magnitude: the compression of a 250 nm²×5 µm gauge, placed 10 µm from the axis of rotation corresponds to the angular stiffness:

$$C_{gau} = k_{gau} d_{gau}^2 = E \frac{t_{gau} w_{gau}}{l_{gau}} d_{gau}^2 = 169 MPa \frac{[250 \text{ nm}]^2}{5 \text{ }\mu\text{m}} 10 \text{ }\mu\text{m}^2 = 2,$$

$$10^{-7} N.m$$

The stiffness of the gauge is:

$$169 MPa \frac{[250 \text{ nm}]^2}{5 \ \mu m} = 2kN.m^{-1}$$

Preferably, the one or more hinging elements have a low thickness.

More specifically, the angular stiffness of a hinge formed of a plurality of parallelepipedal hinging elements perpendicular to the axis of rotation is:

$$C_{hinge} = \frac{E}{3} \frac{t_3^3 w_h}{l_h} \begin{cases} t_3 \text{: thickness of the hinging elements} \\ w_h \text{: cumulative width of the hinging elements} \\ l_h \text{: length of the hinging elements} \end{cases}$$

$$C_{hinge} = \frac{E}{3} \frac{s t_3^2}{l_h}$$

where s: the cumulative section of the hinging elements.
The compression stiffness of this hinge is:

$$K_{hinge} = E \frac{t_3 w_h}{l_h} = E \frac{s}{l_h}$$

It is understood that the cumulative width of the hinging elements can differ from that of the sensing elements.

As a result, by implementing hinging elements having a small thickness and a large width in order to have large sections s, hinging elements can be produced having a high compression stiffness and a low angular stiffness. The ratio $t_3/w_h$ lies in the range 1 to 100 for example.

The hinge joint axis Y defined by the hinging element is situated as close as possible to the hinging element, or is even in the hinging element.

The hinging system further comprises a pair of blades 10 sandwiched between the first part 2 and the second part 4 and extending substantially in a plane orthogonal to the planes P1 and P2 and containing the axis Y.

Each blade 10 is such that it comprises a side edge 10.1 extending between the planes P1 and P2 connected to the first part and the other side edge 10.2 being rigidly secured to the second part. The blades are arranged substantially in the same plane R orthogonal to the planes P1 and P2 and containing the axis of rotation Y. Moreover, the blades are arranged symmetrically on either side of the longitudinal axis X.

The axis of rotation is substantially situated at the intersection between the mean plane R of the blades 10 and the mean plane of the hinging element 10.

The first part 2 comprises a longitudinal end 2.3 facing a longitudinal end 4.3 of the second part.

In the example shown, the first part 2 comprises two protruding side portions 12 and the second part 4 comprises one protruding central portion 14.

Moreover, the longitudinal end 2.3 comprises a central recess 16 substantially corresponding to the central portion 14 and the longitudinal end 2.4 comprises two side recesses 18 substantially corresponding to the side portions 12.

The outer side edge 10.1 is connected to one of the side portions 12 of the first part 2 and the inner side edge 10.2 is connected to the central portion 14 of the second part. In the example shown, the blades are formed in one piece with the first portion and the second portion.

The specific structure of the blades and the connection thereof to the first and second parts in FIG. 1 is provided for the purpose of illustration only and is not intended to limit the scope of the invention. For example, a structure without a recess 16 and central portion 14 remains within the scope of the invention.

The blades 10 are capable of undergoing torsional deformation and limit or even prevent out-of-plane movements, i.e. movements along the axis Z, of the second part 4.

Thus, the second part has a substantially pure rotational movement about the axis Y.

The blades 10 contribute very little or not at all to the definition of the location of the axis of rotation Y.

A device comprising a single blade 10 remains within the scope of the present invention.

The hinged device further comprises a sensing element 20 arranged opposite the hinging element relative to the blades 10.

In the view shown in FIG. 3, the hinging element is situated above the sensing element.

The sensing element 20 can be a strain gauge allowing for the detection of the rotational movement between the first part and the second part and for this movement to be measured. It can be made of a piezoresistive or piezoelectric material. As a variant, the sensing element can comprise at least one resonant beam in order to perform a resonant detection.

As a variant, it can form an actuator and can be made of a piezoelectric material.

In the example shown, the hinging element and the sensing element are arranged one over the other in the direction Z, however a device in which the sensing element and the hinging element are not superimposed in the direction Z remains within the scope of the present invention.

In the case of a strain gauge, the thickness of the gauge in the direction Z is low, allowing the strains to be concentrated and the signal to be amplified. For example, the thickness lies in the range of about one hundred nm to several μm. In the case wherein the sensing element is used as an actuator, the thickness of the sensing element will, for example, also lie in the range of about one hundred nm to several μm.

In the example shown, the sensing element 20 comprises a side contained in the plane P2.

Preferably, the second part has a significant rigidity compared to that of the sensing element. For this purpose, the second part has a thickness in the direction Z that is very high compared to that of the sensing element, for example in the range of several μm to several tens of μm for a thickness of the sensing element in the range of about one hundred nm to several μm. Thus, the second part 4 does not become deformed or becomes so very little, and the energy is conveyed to the sensing element.

By choosing a second thick part, a second rigid part is obtained and the gain in energy is increased. Nonetheless, the gain on the leverage effect is reduced. More specifically, in an ideal case, the gain on the lever arm is equal to the length of the arm divided by the thickness of the second part.

Therefore, a distance between the sides 4.1 and 4.2 of the second part 4 is preferably chosen to be very high compared to the thickness of the sensing element. The ratio between the thickness of the sensing element and that of the second part preferably lies in the range 10 to 1,000.

A plurality of sensing elements arranged parallel to one another between the first part and the second part and distributed along the axis Y could also be provided.

The one or more sensing elements could be provided such that they do not comprise any side contained in the plane P2, but such that they are situated between the plane P2 and the lower edge of the blades 10. In this case, the gain in the lever arm would be slightly increased.

As it will be shown hereafter, the one or more hinging elements and/or the one or more sensing elements and/or the first and/or the second parts can be made from the same material or from different materials.

Preferably, the second part has a dimension in the axis Z that is significantly greater than that of the sensing element and that of the hinging element, thus providing a highly-efficient hinged device. The blades 10 are such that they have a reduced effect on efficiency. More specifically, the compression stiffness of a plurality of parallelepipedal gauges perpendicular to the axis of rotation is:

$$K_{gauge} = E\frac{t_1 w_g}{l_g} \begin{cases} t_1: \text{thickness of the "gauging" layer} \\ w_g: \text{cumulative width of the gauges} \\ l_g: \text{length of the gauges} \end{cases}$$

the angular stiffness induced at the hinging element by said gauges is equal to the compression stiffness of the gauges, multiplied by the square of the runout thereof:

$$C_{gauge} = K_{gauge}\left(\frac{t_1}{2} + t_2 + \frac{t_3}{2}\right)^2 \{t_2: \text{thickness of the "lever arm" layer}$$

In order to produce a highly efficient hinged device, the compression stiffness of the hinge joint is chosen to be significantly greater than that of the sensing elements, and the angular stiffness of the hinge joint is chosen to be significantly lower than that induced by the compression of the sensing elements during the rotation of the second part.

This can be shown as:

$$K_{hinge} \gg K_{gauge} \quad (1)$$

$$C_{hinge} \ll K_{gauge}\left(\frac{t_1}{2} + t_2 + \frac{t_3}{2}\right)^2 \quad (2)$$

This results in:

$$1 \ll \frac{t_3 w_h}{l_h} \bigg/ \frac{t_1 w_g}{l_g} \ll \left(\frac{t_1 + 2t_2 + t_3}{t_3}\right)^2.$$

Thus, by choosing a thickness of the second part $t_2$ that is significantly greater than that $t_1$ of the one or more hinging elements, and than that of the one or more sensing elements $t_3$, a hinged device can be obtained having high efficiency.

The paragraphs below will now describe the functioning of the hinged device.

The case considered is that wherein the hinged device forms a displacement detector, for example an accelerometer. The second part 4 forms an inertial mass sensing the accelerations in the direction Z. When such an acceleration is applied to the second part 4, it undergoes a substantially pure rotational movement about the axis Z, since the blades 10, owing to the large dimension thereof along the axis Z, provide significant rigidity along the axis Z. However, as a result of the low thickness thereof in the direction X, they are capable of undergoing torsional deformation, the torsional stiffness thereof being negligible relative to that resulting from the elongation/compression of the sensing element. This torsional stiffness is also low enough to have little influence or even no influence at all on the rotation of the second part.

The sensing element is thus elongated. In the case of a sensing element made of a piezoresistive material, an elongation thereof causes the electrical resistance thereof to be modified. By polarizing the sensing element, the variation in electrical resistance can be measured and detected, which variation is proportional to the angular displacement of the second part about the axis Y.

As a result of the chosen thicknesses between the hinging element, the sensing element and the second part, the energy of the movement of the second part is largely used in order to deform the sensing element.

The case now considered is that wherein the hinged device forms an actuator. The sensing element is, for example, made of a piezoelectric material. By polarizing the element, it becomes dilated or compressed by piezoelectric effect, which generates a force that is applied to the second part, which will pivot about the axis Y. As a result of the low angular stiffness of the hinge element, the rotational movement is made more effective from an energy consumption perspective.

Example methods for manufacturing a hinged device according to the invention will now be described.

FIG. 5A to 5J shown diagrammatic overhead and sectional views of elements obtained during different steps of an example method of manufacture according to the invention. This method is in particular suited to the manufacture of a device as shown in FIG. 6.

In this example, a silicon-on-insulator (SOI) substrate is used, comprising a silicon substrate 100, a silicon oxide layer 102 and a monocrystalline silicon layer 104, the thickness whereof lies, for example, in the range 100 nm to several μm and is, for example, equal to 250 nm.

During a first step, the one or more sensing elements 8 are produced in the layer 104 by photolithography.

Figure 5A:
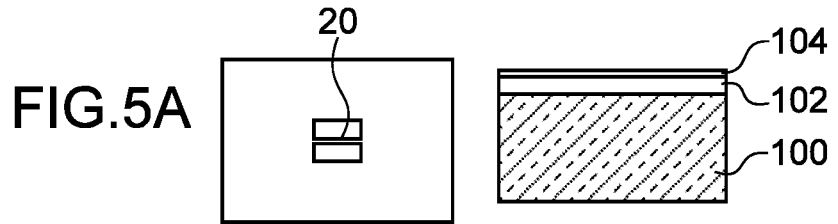
FIG. 5A to 5I are diagrammatic overhead and sectional views of different steps of an example method of manufacturing a hinging device according to the invention.

The element thus obtained is shown in FIG. 5A.

During a subsequent step, a protective layer 106 is formed on the one or more sensing elements 20. This layer is, for example, made of $SiO_2$. The protective layer 106 protects the one or more sensing elements from the different etching processes.

The protective layer 106 is, for example, made by depositing $SiO_2$ on the entire layer 104 and a photolithography step is carried out in order to limit the surface area of the layer 106 to the area containing the one or more sensing elements, the layer 104 is uncovered around the layer 106. A pre-photolithography polishing step can be carried out.

Figure 5B:
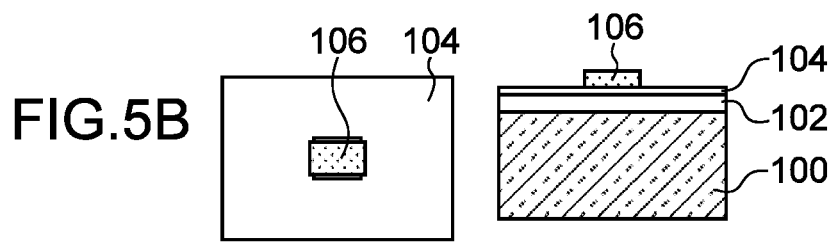

The element thus obtained is shown in FIG. 5B.

During a subsequent step, a silicon layer 108 is formed on the protective layer 106 and on the uncovered area of the layer 104. The layer 108 is intended to form the first part 2 and the second part 4. The layer 108 is, for example, produced by epitaxy or by the deposition of polycrystalline silicon. It has a thickness of 20 μm for example.

Figure 5C:
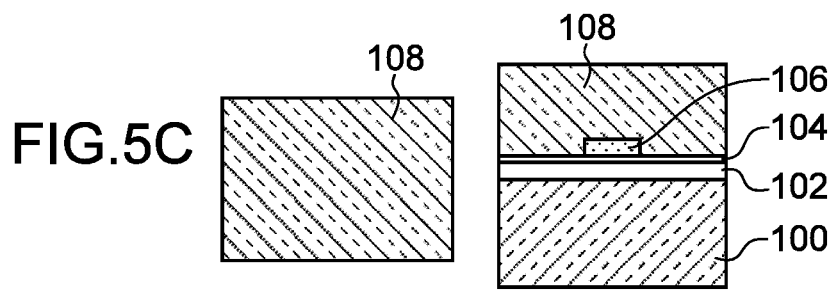

The element thus obtained is shown in FIG. 5C.

During a subsequent step, a trench 109 is made in the layer 108 in order to form the hinging system and separating the first part 2 from the second part 4, in front of the layer 106. This is, for example, a deep reactive-ion etching (DRIE) process.

Figure 5D:
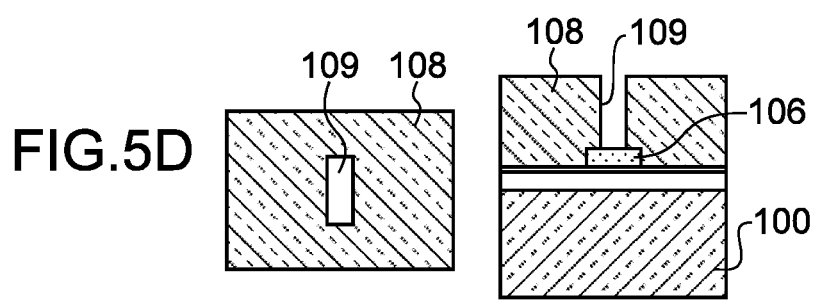

The element thus obtained is shown in FIG. 5D.

During a subsequent step, an oxide layer 110 is formed on the flanks of the etched area. The layer 110 is, for example, formed by thermal oxidation or by conformal oxide deposition.

Figure 5E:
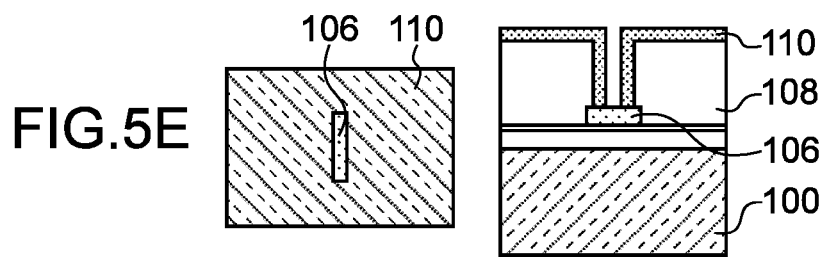

The element thus obtained is shown in FIG. 5E.

During a subsequent step, the oxide formed on the release side of the layer 110 is removed, for example by chemical-mechanical polishing.

Figure 5F:
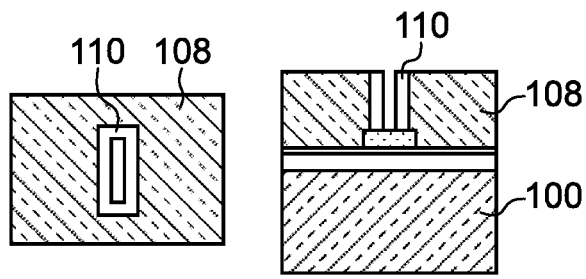

The element thus obtained is shown in FIG. 5F.

During a subsequent step, a layer 112 is formed in order to form the one or more hinging elements. This is, for example, a polycrystalline silicon layer. The layer 112 is intended to fill the trench 109. The layer 112 is, for example, formed by physical vapor deposition (PVD). A conformal deposition is thus carried out.

Figure 5G:
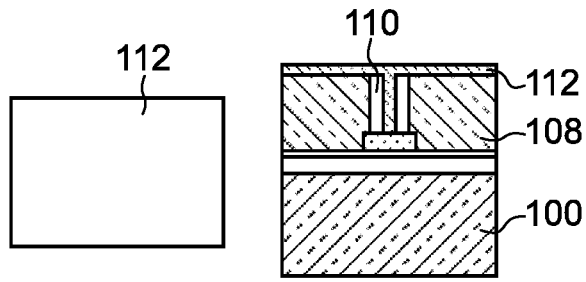
Figure 5H:
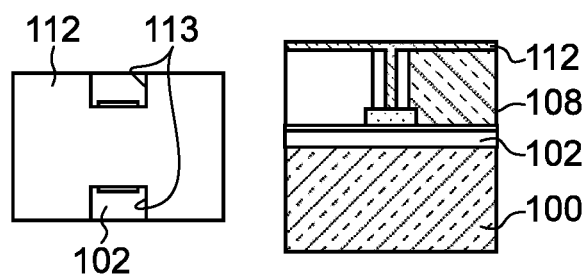

The element thus obtained is shown in FIG. 5G.

During a subsequent step, an etching 113 is carried out in order to delimit the MEMS; this is, for example, a deep etching. The layer 112 is also etched in order to form the one or more hinging elements. Holes are furthermore formed in the parts intended to be movable so as to allow for the passage of the fluid intended to release same.

Figure 5I:
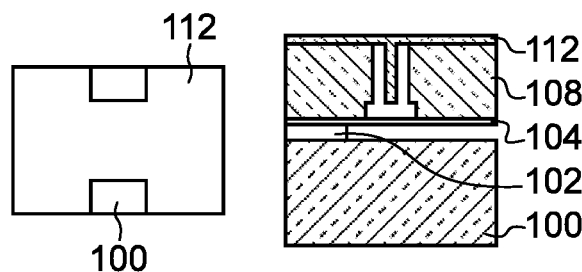

The element thus obtained is shown in FIG. 5I.

During a subsequent step, the structure is released. For this purpose, the oxide 110, the protective layer 106 and the oxide 102 are etched, for example using hydrofluoric acid.

Figure 5J:
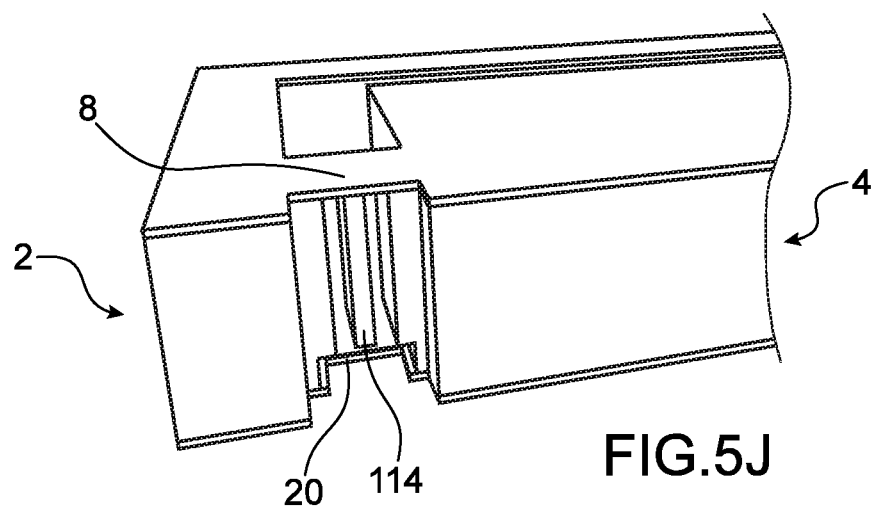
FIG. 5J is a perspective view of the device obtained in FIG. 5I.

FIG. 5J shows the hinging element 8 and the sensing element 20, in addition to the second part 4 suspended by the hinging element 8 and the sensing element 20. The second part 4 is also suspended by the blades 10 (not shown). The hinging element 8 is situated above the sensing element 20 in the diagram in FIG. 5J.

As a result of this method of manufacture, the hinging element comprises a foot 114 extending in the axis Z between the first part and the second part; however, the foot does not contribute to the functioning of the hinging system. The blades 10 are not in contact with the foot 114. The hinging element could be provided such that it comprises a plurality of foots distributed in the direction X without modifying the functioning of the hinging system.

It is understood that the production of the hinging elements and the production of the sensing elements can be reversed.

The steps in FIG. 5A-5I are particularly advantageous if looking to produce electric domains that are insulated from one another on the same MEMS. For example, the structure comprising the foot can be considered such that it is wide enough for the foot 114 to not be released of all of the oxide surrounding same. The upper conductive part would thus be eliminated during etching, producing the element in FIG. 5H. A stack of Si-SiO2-Si-SiO2-Si would be obtained, which ensures mechanical maintenance and which is electrically insulating. This structure would be produced between two areas to be electrically insulated and which would be areas that are different to the areas hinged to one another since they do not form a hinge joint.

As a variant, the substrate 100 of the 501 substrate could be used instead of forming the layer 108, in order to form the first part and the second part. For this purpose, after the step of producing the one or more sensing elements of the layer 104, the element would be turned over and placed on a substrate. A step of etching the substrate 10 then takes place.

As a variant again, the 501 substrate could be omitted and a layer of piezoelectric material could be formed directly on a substrate, for example made of AlN or PZT.

As a variant, based on the element in FIG. 5D, the placement of a monocrystalline layer could be considered, which layer will form the one or more joining elements or the one or more sensing elements, the placement being carried out, for example, by molecular bonding, for example Si—SI, Si—SiO$_2$ or SiO$_2$—SiO$_2$, or by eutectic bonding, for example Or/Si or Al/Ge.

As a variant again, the 501 substrate can be replaced with a standard substrate, in which micropillars are produced, for example by photolithography. They are distributed at the surface of the substrate such that, during annealing, a thin membrane during annealing. The membrane is then machined, for example by photolithography in order to obtain gauges. Oxidation, by consuming the material of the membrane, thus allows the desired gauging section to be obtained and the oxide formed acts as a protective layer protecting from future etchings. The element thus obtained is similar to that shown in FIG. 5B. The subsequent steps are similar to those described hereinabove.

FIG. 6A to 6D show steps of another example method of manufacturing the device according to the invention.

An element similar to that in FIG. 5D is prepared by carrying out the steps described with reference to FIG. 5A to 5D.

Figure 6A:
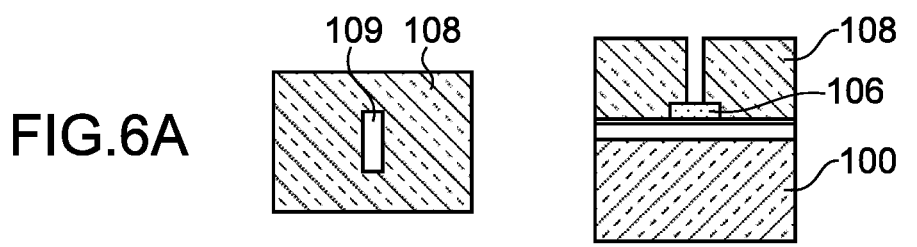
FIG. 6A to 6D are diagrammatic overhead and sectional views of different steps of another example method of manufacturing a device according to the invention.

The element is shown in FIG. 6A.

During a subsequent step, an oxide layer 116 is produced on the layer 108 so as to close off the open end of the trench 109, for example by PVD using SiO$_2$. It can be advantageous to carry out thermal oxidation, prior to producing the layer 116, in order to partially re-obstruct the trench 109.

Figure 6B:
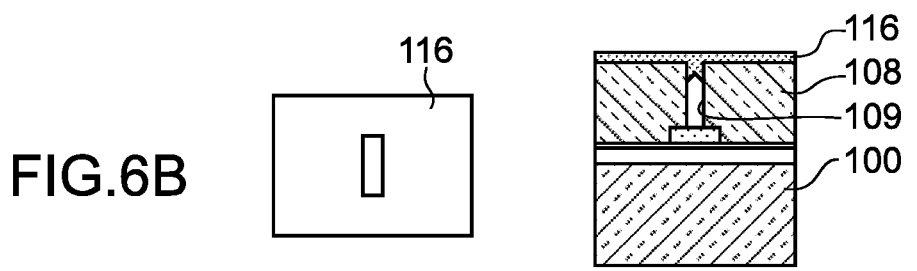

The element thus obtained is shown in FIG. 6B.

During a subsequent step, the layer 116 is structured such that only one portion 116.1 of layer 116 is retained, intended for the formation of the one or more hinging elements. This structuring is, for example, obtained by photolithography. A chemical etching can advantageously be carried out in order to form the slightly inclined flanks 116.2 of the portion 116.1.

Figure 6C:
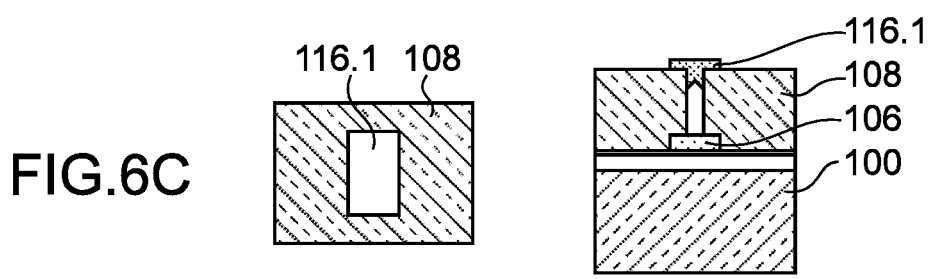

The element thus obtained is shown in FIG. 6C.

During a subsequent step, a layer 118 is formed in order to form the one or more hinging elements. This is, for example, a polycrystalline silicon layer.

Figure 6D:
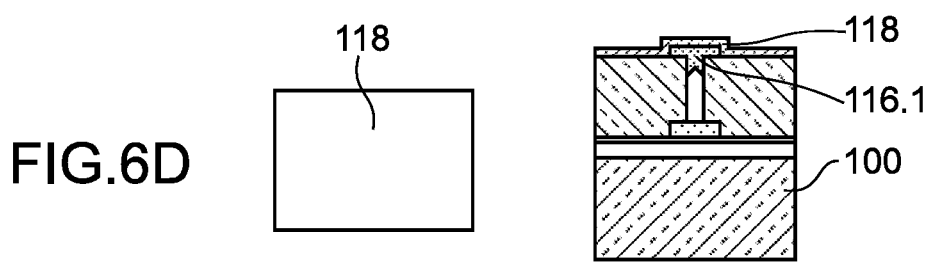

The element thus obtained is shown in FIG. 6D.

During a subsequent step, a structuring of the layer 118 is carried out in order to delimit the MEMS, for example by deep etching. The layer 118 is also structured in order to form the one or more hinging elements. Holes are furthermore formed in the parts intended to be movable so as to allow for the passage of the fluid intended to release same.

During a subsequent step, the structure is released. For this purpose, the oxide 110, the protective layer 106 and the oxide layer 102 are etched, for example using hydrofluoric acid.

Figure 6E:
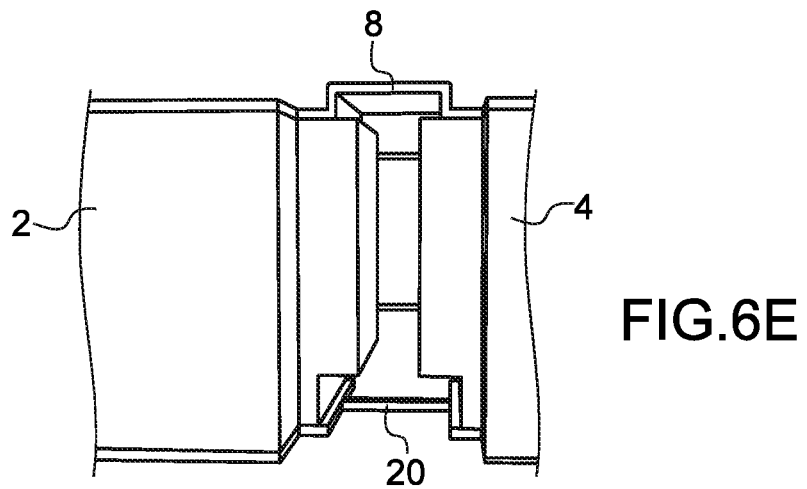
FIG. 6E is a perspective view of the device obtained in FIG. 6D.

FIG. 6E shows the hinging element and the sensing element, in addition to the second part suspended by the hinging element and the sensing element. The movable part is also suspended by the blades 10 (not shown). The hinging element 8 is situated above the sensing element in the diagram in FIG. 6E.

As opposed to the method shown in FIG. 5A to 5J, the hinging element does not have any feet.

Similarly to the method shown in FIG. 5A to 5J, the substrate 100 of the SOI substrate could be used instead of forming the layer 108, in order to form the first part and the second part. For this purpose, after the step of producing the one or more sensing elements of the layer 104, the element is turned over and placed on a substrate. A step of etching the layer 100 then takes place. As a variant again, the 501 substrate could be omitted and a layer of piezoelectric material could be formed directly on a substrate, for example made of AlN or PZT.

As a variant again, as for the method shown in FIG. 5A to 5J, a thin membrane could be produced by annealing.

The method shown in FIG. 6A to 6D is particularly advantageous if looking to produce electric domains that are insulated from one another on the same MEMS . . . .

FIG. 7A to 7E show another example method of manufacturing a device according to the invention.

Figure 7A:
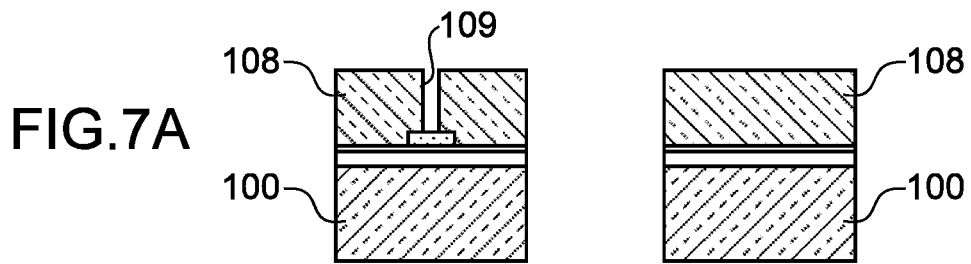
FIG. 7A to 7E are two diagrammatic sectional views in different planes of different steps of an example method of manufacturing a device according to the invention.

FIG. 7A shows an element similar to that in FIG. 5D, which is prepared by carrying out the steps described with reference to FIG. 5A to 5D.

During a subsequent step, the element in FIG. 7A is turned over and is placed on an element comprising a substrate 120 and an oxide layer 121, the placement being carried out, for example, by molecular bonding or by eutectic bonding.

Figure 7B:
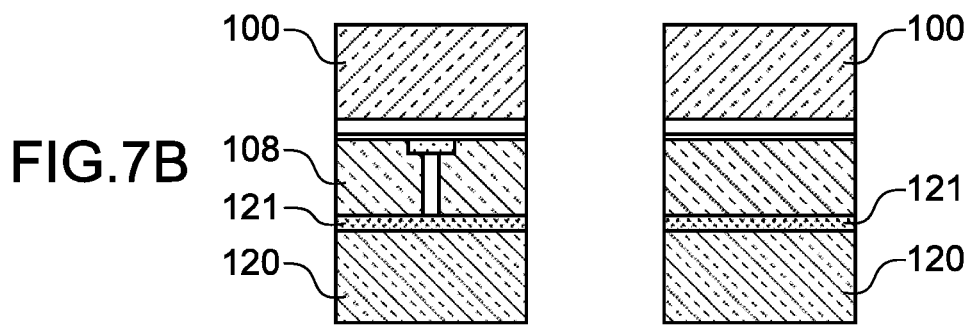

The element thus obtained is shown in FIG. 7B.

During a subsequent step, the substrate 100 and the oxide layer 102 are eliminated, for example by etching and/or grinding.

Figure 7C:
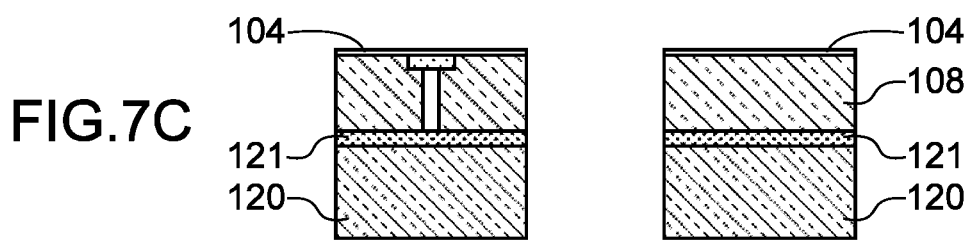

The element thus obtained is shown in FIG. 7C.

During a subsequent step, the layer is structured to form the hinging system, for example by partial etching so as to retain at least one hinging element. The blades were preferentially produced during the previous etching, corresponding to FIG. 5D. A trench 122 is produced, which trench does not open out onto the oxide layer 121 so as to delimit the hinging element 8.

Figure 7D:
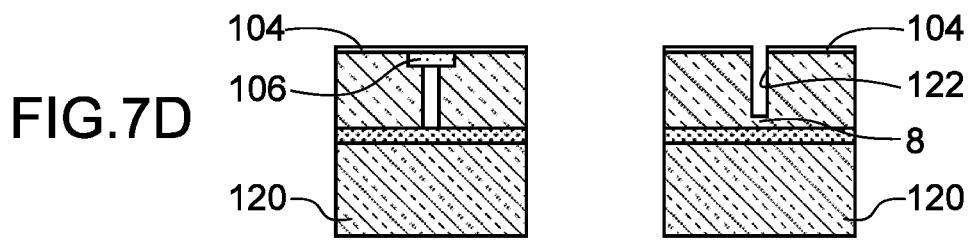

The element thus obtained is shown in FIG. 7D.

During a subsequent step, the structure is released by etching the oxide layer 121; the protective layer 106 of the sensing element is also removed.

Figure 7E:
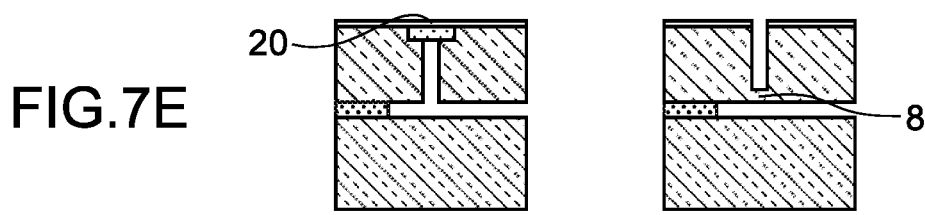

The element thus obtained is shown in FIG. 7E.

In this example method, the hinging element is formed in one piece with the first part and the second part.

FIG. 8A to 8E show another example method of manufacturing a device according to the invention. Similarly to the device obtained at the end of the method in FIG. 7A to 7E, the hinging element is formed in one piece with the first part and the second part.

During a first step, a substrate 123, for example made of silicon, is structured in order to form the hinging system, both the hinging element and the blades 10. For this purpose, the substrate is etched from the front side thereof, for example by DRIE.

Figure 8A:
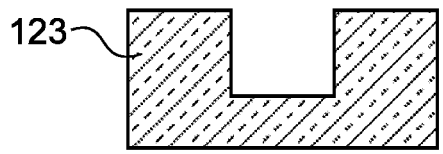
FIG. 8A to 8D are diagrammatic sectional views of different steps of another example method of manufacturing a device according to the invention.

The element thus obtained is shown in FIG. 8A.

During a subsequent step, the etched areas are filled with a material 124 so as to recover a planar front side. This material is, for example, $SiO_2$.

Advantageously, chemical-mechanical polishing of the front side of the substrate is carried out in order to obtain a planar side and in order to remove the oxide from the surface.

Figure 8B:
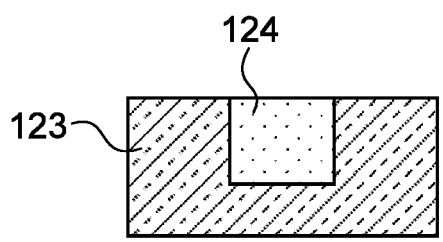

The element thus obtained is shown in FIG. 8B.

During a subsequent step, a layer 126 intended to form the sensing element is formed on the front side of the substrate.

The layer 126 is then structured, for example by photolithography. Advantageously, the remainder of the MEMS can be simultaneously structured.

Figure 8C:
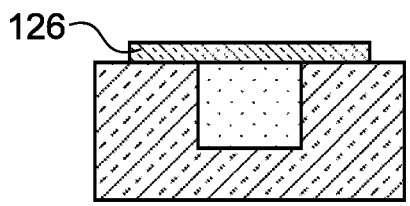

The element thus obtained is shown in FIG. 8C.

During a subsequent step, the structure is released by removing the filling material 124, for example using hydrofluoric acid.

Figure 8D:
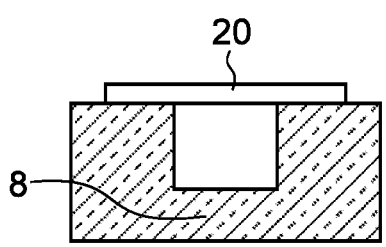

The element thus obtained is shown in FIG. 8D.

As a variant, during the first step, the etching could be used to define the sensing element and the blades 10 and the layer 126 could be used to form the hinging element.

FIG. 9A to 9D show another example method of manufacturing a device according to the invention.

Figure 9A:
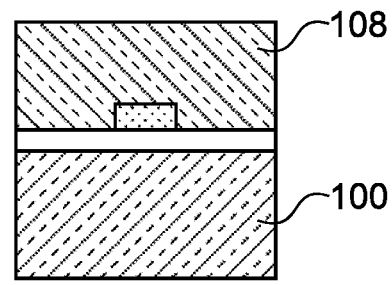
FIG. 9A to 9D are diagrammatic overhead and sectional views of different steps of another example method of manufacturing a device according to the invention.

FIG. 9A shows an element similar to that in FIG. 5C, which is prepared by carrying out the steps described with reference to FIG. 5A to 5C.

During a subsequent step, a layer 128 is formed on the front side of the layer 108. It is made of a different material to that of the layer 128 or is surrounded by a layer protecting it from the chemical attacks that will be applied to the substrate. The layer 128 is, for example, made of AlN or of a piezoelectric material. This layer 128 is, for example, formed by deposition, for example by vapor deposition.

During a subsequent step, the layer 128 is structured so as to form either the one or more sensing elements or the one or more hinging elements. The layer 128 is, for example, structured by photolithography.

During a subsequent step, the layer 108 is etched by deep etching with an etch-stop on the oxide layer 102 and the protective layer. Preferably, during the step of structuring the layer 128, the remaining elements are thin such that they delimit openings that are large enough to carry out deep etching. The layer 108 thus comprises trenches 130. The one or more blades 10 (not shown) are formed during this step.

Figure 9B:
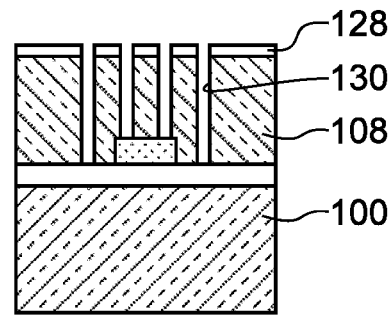

The element thus obtained is shown in FIG. 9B.

During a subsequent step, the portions of layer 106 between the trenches are eliminated, for example by isotropic chemical etching. The elements of the layer 128 forming the hinging elements or the sensing elements are thus released.

Figure 9C:
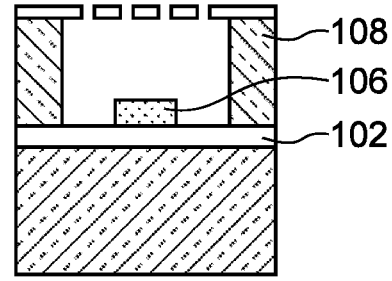

The element thus obtained is shown in FIG. 9C.

During a subsequent step, the protective layer and the oxide layer 104 are eliminated in order to release the structure, for example using hydrofluoric acid.

Figure 9D:
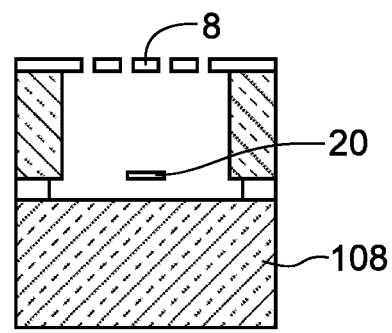

The element thus obtained is shown in FIG. 9D.

Thanks to the present invention, a hinged MEMS and/or NEMS device with out-of-plane movement is thus obtained, procuring high conversion efficiency. This is particularly suited to the production of an out-of-plane movement sensor and to the production of out-of-plane actuators.

The invention claimed is:

1. A hinged device with out-of-plane movement comprising at least a MEMS and/or NEMS device, said hinged device comprising:
   a first part;
   a second part, the second part being hinged to be configured to rotate with respect to the first part about an axis of rotation contained in a plane parallel to a mean plane of the device;
   at least one hinging element connecting the first part and the second part and stressed flexurally;
   at least one sensing element extending between the first part and the second part and being configured to be deformed during the movement of the second part relative to the first part; and
   at least one blade extending perpendicularly to the mean plane of the hinged device and parallel to the axis of rotation, said at least one blade connecting the first part and the second part and being configured to be stressed torsionally during the movement of the second part relative to the first part, said at least one blade being arranged between the hinging element and the sensing element in a direction that is orthogonal to the mean plane of the device.

2. The hinged device according to claim 1, wherein the hinging element has a lower angular stiffness compared to an angular stiffness produced by the sensing element and has a higher compression stiffness compared to a compression stiffness of the sensing element.

3. The hinged device according to claim 1, wherein the hinging element has a dimension in a direction perpendicular to the mean plane of the device that is small compared to that in the direction of the axis of rotation.

4. The hinged device according to claim 1, wherein the second part has a dimension in a direction orthogonal to the mean plane of the hinged device that is larger compared to a dimension in a direction orthogonal to the mean plane of the hinging element and of the sensing element.

5. The hinged device according to claim 1, comprising two blades which are configured to be torsionally-stressed.

6. The hinged device according to claim 1, wherein the hinging element and/or the sensing element is or are formed in one piece with the first part and the second part.

7. The hinged device according to claim 1, comprising a plurality of hinging elements parallel to one another and/or a plurality of sensing elements parallel to one another.

8. A MEMS and/or NEMS sensor comprising at least one hinged device according to claim 1, the at least one sensing element comprising a piezoelectric material, a piezoeresistive material or a resonant gauge.

9. A MEMS and/or NEMS actuator comprising at least one hinged device according to claim 1, the at least one sensing element comprising a piezoelectric material.

10. A method for manufacturing the hinged device according to claim 1, comprising, from a substrate comprising a first thick layer of semi-conductive material, a first oxide layer and a monocrystalline semi-conductive layer on the oxide layer, the steps of:
    a) structuring the monocrystalline semi-conductive layer to form the at least one hinging element or the at least one sensing element,
    b) forming a localized protective layer on said at least one hinging element or at least one sensing element,
    c) forming a second thick layer on the protective layer,
    d) forming a trench in front of the protective layer and opening out onto said protective layer,
    e) at least partially obstructing said trench,
    f) forming the at least one sensing element or at least one hinging element and the at least one blade configured to be torsionally secured,
    g) releasing the hinged device.

11. The method of manufacture according to claim 10, wherein the partial obstruction of the trench comprises fully closing off the trench at one open end or the formation of a layer on the walls of the trench.

12. The method of manufacture according to claim 10, wherein the second thick layer is formed by epitaxy.

13. The method of manufacturing the hinged device according to claim 10, comprising, after step d), the steps of:
    placing on an element comprising at least one third thick semi-conductive layer and a second oxide layer such that the second thick layer and the second oxide layer are in contact with one another,
    removing the first thick layer and the first oxide layer, and
    structuring the second thick layer so as to form the at least one sensing element or at least one hinging element and the at least one blade intended to be torsionally secured.

14. A method of manufacturing the hinged device according to claim 1, comprising, from a thick substrate, the steps of:
    producing a trench so as to delimit the at least one sensing element or at least one hinging element and the at least one blade intended to be torsionally secured,
    entirely filling said trench with a material,
    forming a layer on the material filling the trench and on the substrate,
    structuring said layer so as to delimit the at least one hinging element or the at least one sensing element,
    removing the material filling the trench.

15. A method for manufacturing the hinged MEMS and/or NEMS device according to claim 1, comprising, from a substrate comprising a first thick layer of semi-conductive material, a first oxide layer and a monocrystalline semi-conductive layer on the oxide layer, the steps of:
    a') structuring the monocrystalline semi-conductive layer so as to form at least one hinging element or at least one sensing element,
    b') forming a localized protective layer on said at least one hinging element or at least one sensing element,
    c') forming a second thick layer on the protective layer,
    d') forming a layer intended to form the at least one hinging element or the at least one sensing element,
    e') structuring said layer intended to form the at least one hinging element or the at least one sensing element, so as to form the at least one hinging element or the at least one sensing element,
    f') deep etching the second thick layer until reaching the protective layer and the first oxide layer,
    g') releasing the device.

16. The hinged device according to claim 1, wherein the longest extension of the at least one blade extends perpendicularly to the mean plane.

* * * * *